US012802675B2

(12) United States Patent
Nonaka et al.

(10) Patent No.: US 12,802,675 B2
(45) Date of Patent: Nov. 17, 2026

(54) SOUNDPROOF HEAT-DISSIPATING COVER

(71) Applicant: Sumitomo Riko Company Limited, Aichi (JP)

(72) Inventors: Toshiya Nonaka, Aichi (JP); Koji Tomiyama, Aichi (JP); Nobuyoshi Seto, Aichi (JP); Yusuke Hayazaki, Aichi (JP)

(73) Assignee: Sumitomo Riko Company Limited, Aichi (JP)

(*) Notice: Subject to any disclaimer, the term of this patent is extended or adjusted under 35 U.S.C. 154(b) by 241 days.

(21) Appl. No.: 18/939,434

(22) Filed: Nov. 6, 2024

(65) Prior Publication Data

US 2025/0061875 A1 Feb. 20, 2025

Related U.S. Application Data

(63) Continuation of application No. PCT/JP2023/039596, filed on Nov. 2, 2023.

(30) Foreign Application Priority Data

Nov. 4, 2022 (JP) ................................ 2022-177359

(51) Int. Cl.
*G10K 11/162* (2006.01)
*H05K 7/20* (2006.01)

(52) U.S. Cl.
CPC ....... *G10K 11/162* (2013.01); *H05K 7/20409* (2013.01)

(58) Field of Classification Search
CPC ... G10K 11/162; H05K 7/20409; F02B 77/13; B60R 13/0884; F02C 29/066
See application file for complete search history.

(56) References Cited

U.S. PATENT DOCUMENTS

2023/0272740 A1 8/2023 Onishi et al.

FOREIGN PATENT DOCUMENTS

CN 217506891 U * 9/2022
DE 102004062331 B4 * 11/2007 ......... B60R 13/0876

(Continued)

OTHER PUBLICATIONS

"International Search Report (Form PCT/ISA/210) of PCT/JP2023/039596", mailed on Jan. 16, 2024, with English translation thereof, pp. 1-4.

*Primary Examiner* — Jeremy A Luks
(74) *Attorney, Agent, or Firm* — JCIPRNET

(57) ABSTRACT

A soundproof heat-dissipating cover covering a target object includes: a sound-absorbing heat-dissipating sheet including a covering surface covering a surface of the target object and a heat-dissipating surface on a side opposite to the covering surface; and a reinforcing member covering the sound-absorbing heat-dissipating sheet from a heat-dissipating surface side of the sound-absorbing heat-dissipating sheet. The sound-absorbing heat-dissipating sheet further includes: a pair of first mounting parts, and a heat-dissipating region formed between the pair of first mounting parts. The heat-dissipating surface in the heat-dissipating region is formed with ridges arranged side by side at an interval. The reinforcing member includes: a pair of second mounting parts respectively mounted to the pair of first mounting parts; and a bridging part bridging between the pair of second mounting parts and having through-holes. The ridges of the sound-absorbing heat-dissipating sheet abut against the bridging part of the reinforcing member.

18 Claims, 10 Drawing Sheets

(56) References Cited

FOREIGN PATENT DOCUMENTS

| | | | | | |
|---|---|---|---|---|---|
| JP | 2006257993 | A | * | 9/2006 | |
| JP | 3940053 | B2 | * | 7/2007 | .............. F16L 59/08 |
| JP | 2008273353 | A | * | 11/2008 | |
| JP | 2017146340 | A | * | 8/2017 | ........... G10K 11/172 |
| JP | 2022019421 | A | * | 1/2022 | |
| WO | WO-2009004766 | A1 | * | 1/2009 | ................ F24F 1/12 |
| WO | WO-2020110320 | A1 | * | 6/2020 | ............. G10K 11/16 |
| WO | 2022124113 | | | 6/2022 | |

* cited by examiner

SOUNDPROOF HEAT-DISSIPATING COVER

CROSS-REFERENCE TO RELATED APPLICATION

The present application is a continuation of PCT/JP2023/039596, filed on Nov. 2, 2023, and is related to and claims priority from Japanese patent application no. 2022-177359, filed on Nov. 4, 2022. The entire contents of the aforementioned applications are hereby incorporated by reference herein.

BACKGROUND

Technical Field

The present disclosure relates to a soundproof heat-dissipating cover.

Related Art

As described in Patent Document 1 (International Publication No. 2022/124113), it has been known to mount a soundproof cover to a drive source of a vehicle. Patent Document 1 describes a soundproof cover covering a target object. The soundproof cover includes a sound-absorbing sheet that is formed of a sound-absorbing material into a surface shape and covers a surface of the target object, and a reinforcing member that positions the sound-absorbing sheet with respect to the target object.

The reinforcing member positions the sound-absorbing sheet with respect to the target object in a state exposing at least a part of the sound-absorbing sheet. Accordingly, in the case where the target object generates heat, the heat generated from the target object is transmitted to the sound-absorbing sheet, and further dissipated to outside from portions of the sound-absorbing sheet exposed to outside. Accordingly, a heat dissipation performance for the target object can be improved.

According to the above art, depending on conditions of use, such as the case of mounting the soundproof cover to a large target object from below, the portions of the sound-absorbing sheet exposed from the reinforcing member may sag downward due to gravity, and a gap may form between the target object and the sound-absorbing sheet. As a result, heat may become trapped on the target object due to an air layer formed at the gap between the target object and the sound-absorbing sheet, and the heat dissipation performance for the target object may deteriorate.

SUMMARY

An aspect of the present disclosure is a soundproof heat-dissipating cover covering a target object. The soundproof heat-dissipating cover includes a sound-absorbing heat-dissipating sheet and a reinforcing member. The sound-absorbing heat-dissipating sheet is formed of a first sound-absorbing material into a surface shape, and includes a covering surface covering a surface of the target object and a heat-dissipating surface on a side opposite to the covering surface. The reinforcing member is formed of a material having a hardness higher than the first sound-absorbing material, and covers the sound-absorbing heat-dissipating sheet from a heat-dissipating surface side of the sound-absorbing heat-dissipating sheet. The sound-absorbing heat-dissipating sheet further includes a pair of first mounting parts formed at positions near both ends in a first direction along the covering surface, and a heat-dissipating region formed between the pair of first mounting parts. The heat-dissipating surface in the heat-dissipating region of the sound-absorbing heat-dissipating sheet is formed with a plurality of ridges arranged side by side at an interval. The reinforcing member includes a pair of second mounting parts and a bridging part. The pair of second mounting parts are formed at positions near both ends in the first direction and are respectively mounted to the pair of first mounting parts. The bridging part bridges between the pair of second mounting parts and has a plurality of through-holes. With the pair of second mounting parts of the reinforcing member mounted to the pair of first mounting parts of the sound-absorbing heat-dissipating sheet, the plurality of ridges of the sound-absorbing heat-dissipating sheet abut against the bridging part of the reinforcing member.

According to an aspect of the present disclosure, with the plurality of ridges of the sound-absorbing heat-dissipating sheet abutting against the bridging part of the reinforcing member, the plurality of ridges of the sound-absorbing heat-dissipating sheet are supported by the bridging part of the reinforcing member. Accordingly, deformation of the sound-absorbing heat-dissipating sheet into a protruding shape in a direction from the covering surface toward the heat-dissipating surface is suppressed. As a result, since deflection deformation of the covering surface of the sound-absorbing heat-dissipating sheet away from the target object is suppressed, formation of a gap between the target object and the covering surface of the sound-absorbing heat-dissipating sheet is suppressed. Accordingly, since heat generated from the target object is quickly conducted to the sound-absorbing heat-dissipating sheet, the heat dissipation performance of the soundproof heat-dissipating cover is improved.

Reference signs in parentheses described in the claims indicate correspondences with specific means described in the embodiments to be described later, and are not intended to limit the technical scope of the present disclosure.

DESCRIPTION OF EMBODIMENTS

Embodiments of the present disclosure provide a soundproof heat-dissipating cover with an improved heat dissipation performance. Hereinafter, the embodiments of the disclosure will be described with reference to the drawings.

Embodiment 1

1. Basic Configuration of Soundproof Heat-Dissipating Cover 1

A basic configuration of a soundproof heat-dissipating cover 1 will be described with reference to FIG. 1, FIG. 3, and FIG. 4. The soundproof heat-dissipating cover 1 has a function of covering a target object 2 to suppress transmission of sound generated by the target object 2 to outside, and a function of dissipating heat of the target object 2 to outside. The target object 2 is, for example, a power source of a vehicle. The power source may be a drive motor of a vehicle, a drive engine of a vehicle, etc.

Figure 1:
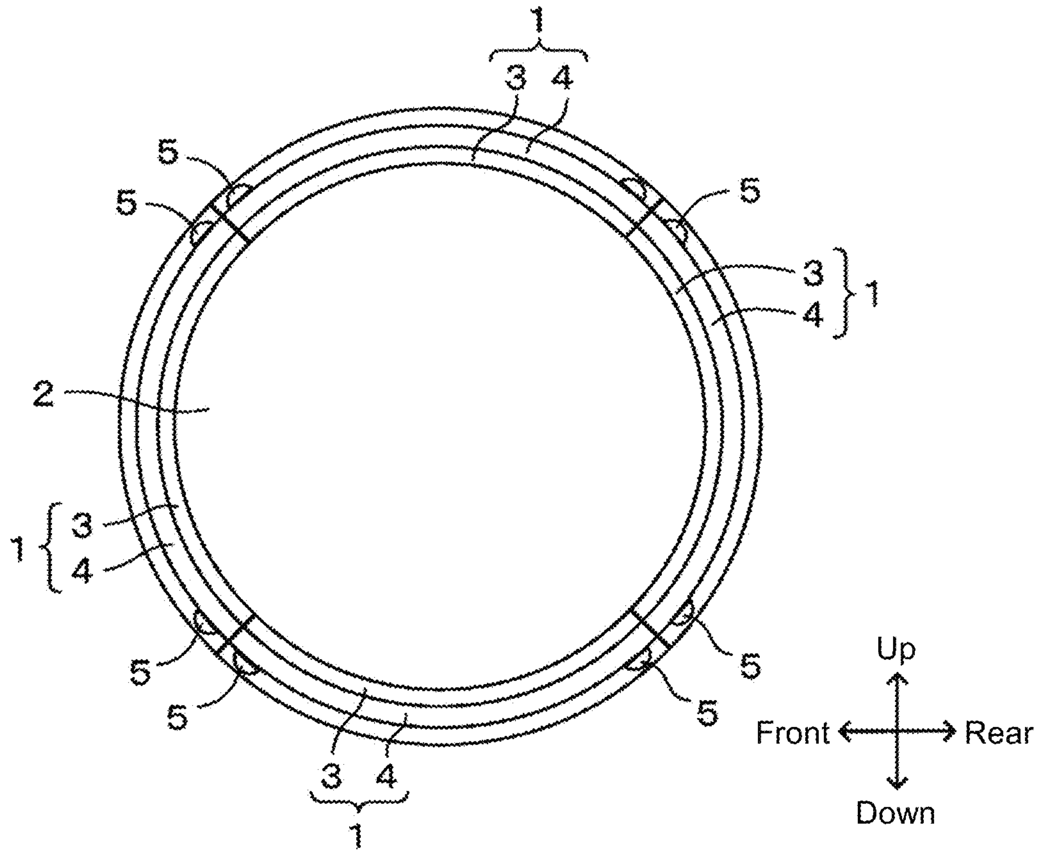
FIG. 1 is a side view showing a state in which a soundproof heat-dissipating cover of Embodiment 1 is mounted to a target object.

Herein, FIG. 1 shows a case where the target object 2 is a drive motor of a vehicle. Further, the drive motor in FIG. 1 is exemplified as having a cylindrical outer circumferential surface. However, the outer circumferential surface of the drive motor is not limited to a cylindrical surface, and may also be formed with protrusions and recesses as appropriate.

In this embodiment, the drive motor is disposed such that a rotational axis of the drive motor is in line with a left-right direction of the vehicle. A left side of FIG. 1 represents a vehicle front side, and a right side of FIG. 1 represents a vehicle rear side. A vehicle front surface of the drive motor is a region capable of directly receiving an airflow due to vehicle traveling. Further, both upper and lower lateral surfaces of the drive motor are also capable of receiving an airflow flowing from the front side to the rear side due to vehicle traveling. A vehicle rear surface of the drive motor is a region that does not directly receive an airflow during vehicle traveling.

On the other hand, in a stopped state of the vehicle, air circulates in an up-down direction due to natural convection. Thus, a lower surface of the drive motor is a surface capable of directly receiving an airflow due to natural convection. Further, both front and rear lateral surfaces of the drive motor are also capable of receiving an airflow circulating from the lower side to the upper side due to natural convection. An upper surface of the drive motor is a region that does not directly receive an airflow due to natural convection.

As described above, in both states of vehicle traveling and vehicle stoppage, at least one of the lateral surfaces in a circumferential direction of the drive motor is a surface capable of receiving an airflow.

However, the drive motor may also be configured to be disposed such that the rotational axis of the drive motor is in line with a front-rear direction of the vehicle. In that case, since air flows along an axial direction of the drive motor, both upper and lower lateral surfaces and both left and right lateral surfaces of the drive motor are regions capable of directly receiving an airflow due to vehicle traveling.

The soundproof heat-dissipating cover 1 covers the surface of the target object 2. For example, as shown in FIG. 1, in the case where the target object 2 is a drive motor, the soundproof heat-dissipating cover 1 covers an outer circumferential surface of the drive motor. The soundproof heat-dissipating cover 1 covers an entire circumference of the outer circumferential surface of the target object 2, but a portion that is not covered may also be provided. In this embodiment, four soundproof heat-dissipating covers 1 cover the outer circumferential surface of the target object 2. In this embodiment, the four soundproof heat-dissipating covers 1 cover an upper surface, a lower surface, a front surface, and a rear surface of the target object 2. However, the number of soundproof heat-dissipating covers 1 may also be 1 to 3, or 5 or more.

The soundproof heat-dissipating cover 1 includes a sound-absorbing heat-dissipating sheet 3 and a reinforcing member 4. The sound-absorbing heat-dissipating sheet 3 is formed of a first sound-absorbing material having sound-absorbing properties into a surface shape, and covers the surface of the target object 2. Thus, a soundproofing effect can be obtained by the sound-absorbing heat-dissipating sheet 3. The sound-absorbing heat-dissipating sheet 3 may also be formed into a shape corresponding to the surface shape of the target object 2 in advance. Further, the sound-absorbing heat-dissipating sheet 3 may also be formed of a deformable material into a planar shape, and mounted to the surface of the target object 2 while being deformed. The sound-absorbing heat-dissipating sheet 3 has heat-dissipating properties in addition to sound-absorbing properties. The sound-absorbing heat-dissipating sheet 3 includes a covering surface 10 that covers the surface of the target object 2, and a heat-dissipating surface 11 on the opposite side of the covering surface 10.

A first sound-absorbing material constituting the sound-absorbing heat-dissipating sheet 3 may be formed of a material with excellent sound-absorbing properties such as a foamed resin. Examples of the foamed resin applicable may include a urethane foam, an acrylic foam, a silicone foam, a styrene foam, foamed olefin (foamed PP, foamed PE), foamed PVC, foamed EVA, foamed PA, etc. An Asker C hardness of the foamed resin of the sound-absorbing heat-dissipating sheet 3 is 1 to 60 degrees. The sound-absorbing heat-dissipating sheet 3 may also be formed of a non-foamed resin having sound-absorbing properties, or may also be formed of a metal. Examples of the non-foamed resin applicable may include a polyamide resin, an olefin resin, a styrene resin, a urethane resin, a silicone resin, an acrylic resin, a polyvinyl chloride resin, a polyethylene resin, a polyethylene terephthalate resin, a polycarbonate resin, a polypropylene resin, an ABS resin, an EVA resin, a carbon fiber plastic (FRP, CFRP), etc. Further, examples of the metal applicable may include iron, aluminum, stainless steel, copper, and alloys thereof. However, a foamed resin with excellent sound-absorbing properties is preferable in an exemplary embodiment.

Furthermore, to provide the sound-absorbing heat-dissipating sheet 3 with heat-dissipating properties, the sound-absorbing heat-dissipating sheet 3 may be formed of a foamed resin containing a heat-conductive material. The heat-conductive material may be extended from the covering surface 10 of the sound-absorbing heat-dissipating sheet 3 toward the heat-dissipating surface 11. For example, in the case where the heat-conductive material is a heat-conductive filler, the heat-conductive filler is arranged from the covering surface 10 of the sound-absorbing heat-dissipating sheet 3 toward the heat-dissipating surface 11. Furthermore, a filling amount of the heat-conductive material may vary depending on the position of the sound-absorbing heat-dissipating sheet 3. For example, since the vehicle rear surface is more difficult to cool than the vehicle front surface, the filling amount of the heat-conductive material on the vehicle rear surface may be increased compared to the vehicle front surface. Herein, the filling amount refers to a filling amount per unit area in a plane direction of the sound-absorbing heat-dissipating sheet 3. Further, in the case where the heat-conductive material is a metal plate, the heat-conductive material may be insert-molded to extend from the covering surface 10 of the sound-absorbing heat-dissipating sheet 3 toward the heat-dissipating surface 11.

In a state of covering the sound-absorbing heat-dissipating sheet 3 from the heat-dissipating surface 11 side, the reinforcing member 4 positions the sound-absorbing heat-dissipating sheet 3 with respect to the target object 2. The reinforcing member 4 is formed separately from the sound-absorbing heat-dissipating sheet 3, and is disposed on the heat-dissipating surface 11 side of the sound-absorbing heat-dissipating sheet 3 such that the sound-absorbing heat-dissipating sheet 3 is interposed between the reinforcing member 4 and the target object 2.

Further, as a method for fixing to the target object 2, for example, as shown in FIG. 1, the reinforcing member 4 may be fixed to the target object 2 by bolts 5. The sound-absorbing heat-dissipating sheet 3 has first insertion holes 12 that are formed to penetrate the sound-absorbing heat-dissipating sheet 3 and into which the bolts 5 are inserted (see FIG. 3). The reinforcing member 4 has second insertion holes 20 that are formed to penetrate the reinforcing member 4 and into which the bolts 5 are inserted (see FIG. 4). However, the method of fixing the reinforcing member 4 and the target object 2 is not limited to bolt fastening, and for example, the reinforcing member 4 may also be configured to engage with engaging claws provided at the target object 2. In the case where the reinforcing member 4 and the target object 2 are not fastened by bolts, the first insertion holes 12 and the second insertion holes 20 are omitted.

The reinforcing member 4 is formed of a material with a hardness higher than the sound-absorbing heat-dissipating sheet 3. In this embodiment, the sound-absorbing heat-dissipating sheet 3 is formed of, for example, a foamed resin into a surface shape. An Asker C hardness of the foamed resin of the reinforcing member 4 is 60 to 99 degrees. Thus, in the case where the sound-absorbing heat-dissipating sheet 3 is formed of a first sound-absorbing material that does not have a sufficient rigidity, a positioning effect with respect to the target object 2 by the sound-absorbing heat-dissipating sheet 3 alone is low. Even in such a case, with the reinforcing member 4, the sound-absorbing heat-dissipating sheet 3 can be reliably positioned with respect to the target object 2.

Furthermore, the reinforcing member 4 is formed of a material with a mass per unit volume (hereinafter referred to as a "unit mass") greater than the sound-absorbing heat-dissipating sheet 3. As described above, to enable the reinforcing member 4 to exhibit a reinforcing function, the reinforcing member 4 is consequently formed of a material with a unit mass greater than the sound-absorbing heat-dissipating sheet 3.

The reinforcing member 4 may also be configured to be formed of a second sound-absorbing material having sound-absorbing properties. The second sound-absorbing material may be formed of a material with excellent sound-absorbing properties such as a foamed resin. However, the foamed resin applicable to the reinforcing member 4 is different from the foamed resin applicable to the sound-absorbing heat-dissipating sheet 3. For example, examples of the foamed resin applicable to the reinforcing member 4 may include a urethane foam, an acrylic foam, a silicone foam, a styrene foam, foamed olefin (foamed PP, foamed PE), foamed PVC, foamed EVA, foamed PA, etc. Even if the urethane foam is applied to the sound-absorbing heat-dissipating sheet 3 and the reinforcing member 4, the urethane foams of the two are of different types. By forming the reinforcing member 4 with the second sound-absorbing material, the soundproofing properties of the soundproof heat-dissipating cover 1 can be improved.

Further, the reinforcing member 4 may also include a material different from the second sound-absorbing material, such as a foamed rubber, a non-foamed resin, or a metal. Examples of the foamed rubber applicable may include foamed EPDM, foamed CR, foamed NBR/PVC, foamed ACM, etc. Further, examples of the non-foamed resin applicable may include a polyamide resin, an olefin resin, a styrene resin, a urethane resin, a silicone resin, an acrylic resin, a polyvinyl chloride resin, a polyethylene resin, a polyethylene terephthalate resin, a polycarbonate resin, a polypropylene resin, an ABS resin, an EVA resin, a carbon fiber plastic (FRP, CFRP), etc. Further, examples of the metal applicable may include iron, aluminum, stainless steel, copper, and alloys thereof. In these cases, the reinforcing member is formed of a rubber, a resin, or a metal with a hardness higher than a foamed resin. However, from the perspective of weight reduction, a foamed resin is preferable in an exemplary embodiment.

Further, the reinforcing member 4 is not disposed to cover the entire surface of the sound-absorbing heat-dissipating sheet 3, and is disposed in a state of exposing at least a part of the sound-absorbing heat-dissipating sheet 3. As described above, the sound-absorbing heat-dissipating sheet 3 has heat-dissipating properties in addition to sound-absorbing properties. Thus, by exposing the sound-absorbing heat-dissipating sheet 3, a heat dissipation performance due to the sound-absorbing heat-dissipating sheet 3 can be effectively exhibited.

In the case where the reinforcing member 4 has a flexibility allowing deflection deformation, the reinforcing member 4 may be mounted to the outer circumferential surface of the target object 2 while being deformed to conform to the shape of the outer circumferential surface of the target object 2. Further, in the case where the reinforcing member 4 has a high hardness and is thus difficult to deflect and deform, the reinforcing member 4 may be formed in advance to conform to the shape of the outer circumferential surface of the target object 2. Accordingly, the reinforcing member 4 can be easily mounted to the outer circumferential surface of the target object 2.

2. Detailed Configuration of Soundproof Heat-Dissipating Cover 1

A detailed configuration of the soundproof heat-dissipating cover 1 will be described with reference to FIG. 1 to FIG. 8. As shown in FIG. 1, the soundproof heat-dissipating cover 1 is formed into a shape corresponding to the surface shape of the target object 2. However, to facilitate description, FIG. 2 to FIG. 8 show the soundproof heat-dissipating cover 1 in a state expanded into a planar shape, and the following description will refer to these figures.

Figure 2:
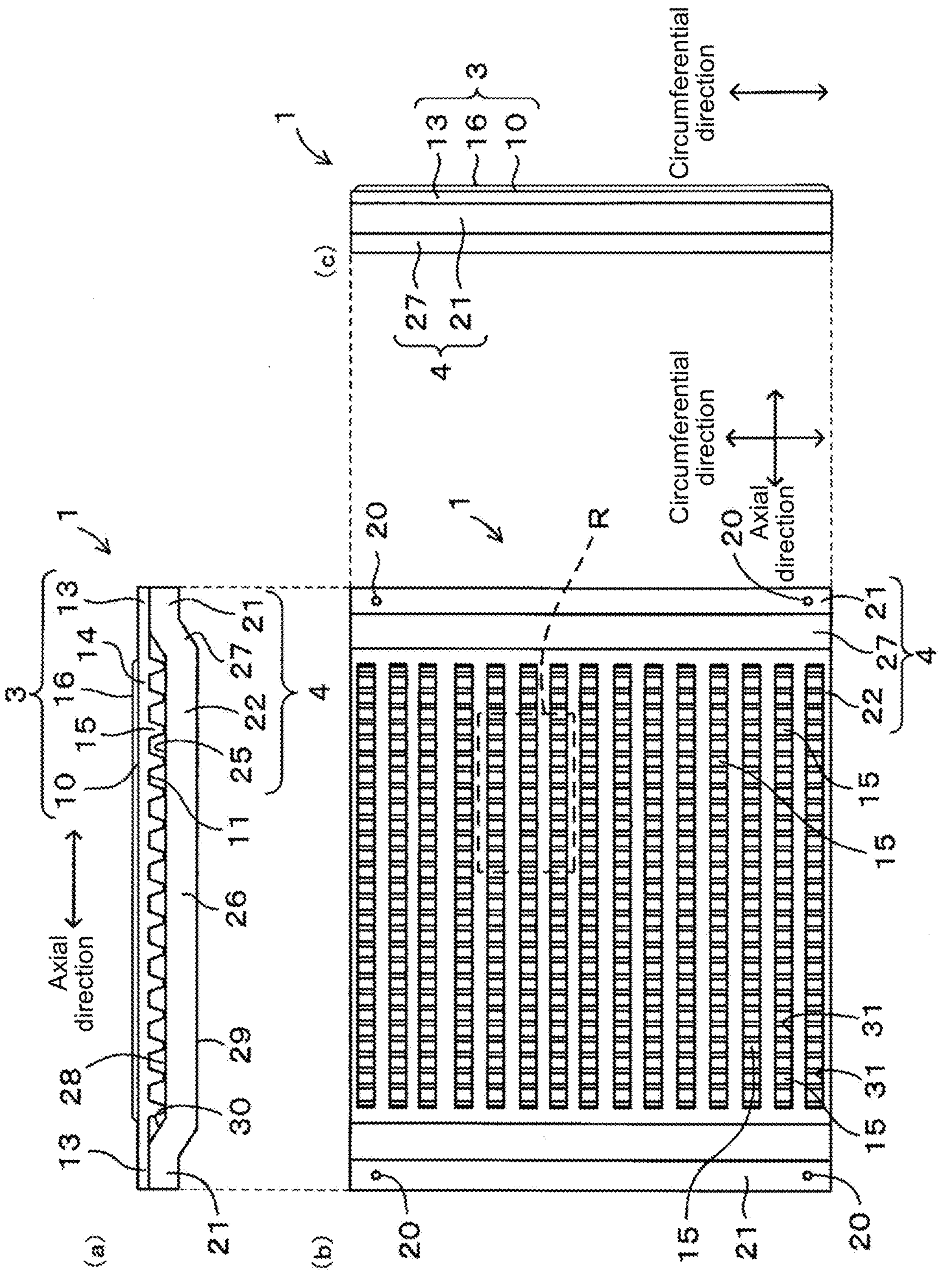
FIG. 2 is a view showing the soundproof heat-dissipating cover of Embodiment 1, where (a) is a top view, (b) is a front view, and (c) is a right side view.

As shown in (a) of FIG. 2 and (c) of FIG. 2, the soundproof heat-dissipating cover 1 includes a sound-absorbing heat-dissipating sheet 3 and a reinforcing member 4. The sound-absorbing heat-dissipating sheet 3 and the reinforcing member 4 will be described in detail below. In this example, the sound-absorbing heat-dissipating sheet 3 is composed of one sheet only. However, the sound-absorbing heat-dissipating sheet 3 may also be composed of a plurality of divide bodies formed separately. The soundproof heat-dissipating cover 1 is formed into a substantially rectangular shape in a plan view. However, the shape of the soundproof heat-dissipating cover 1 is not particularly limited and may be formed into any shape.

Figure 3:
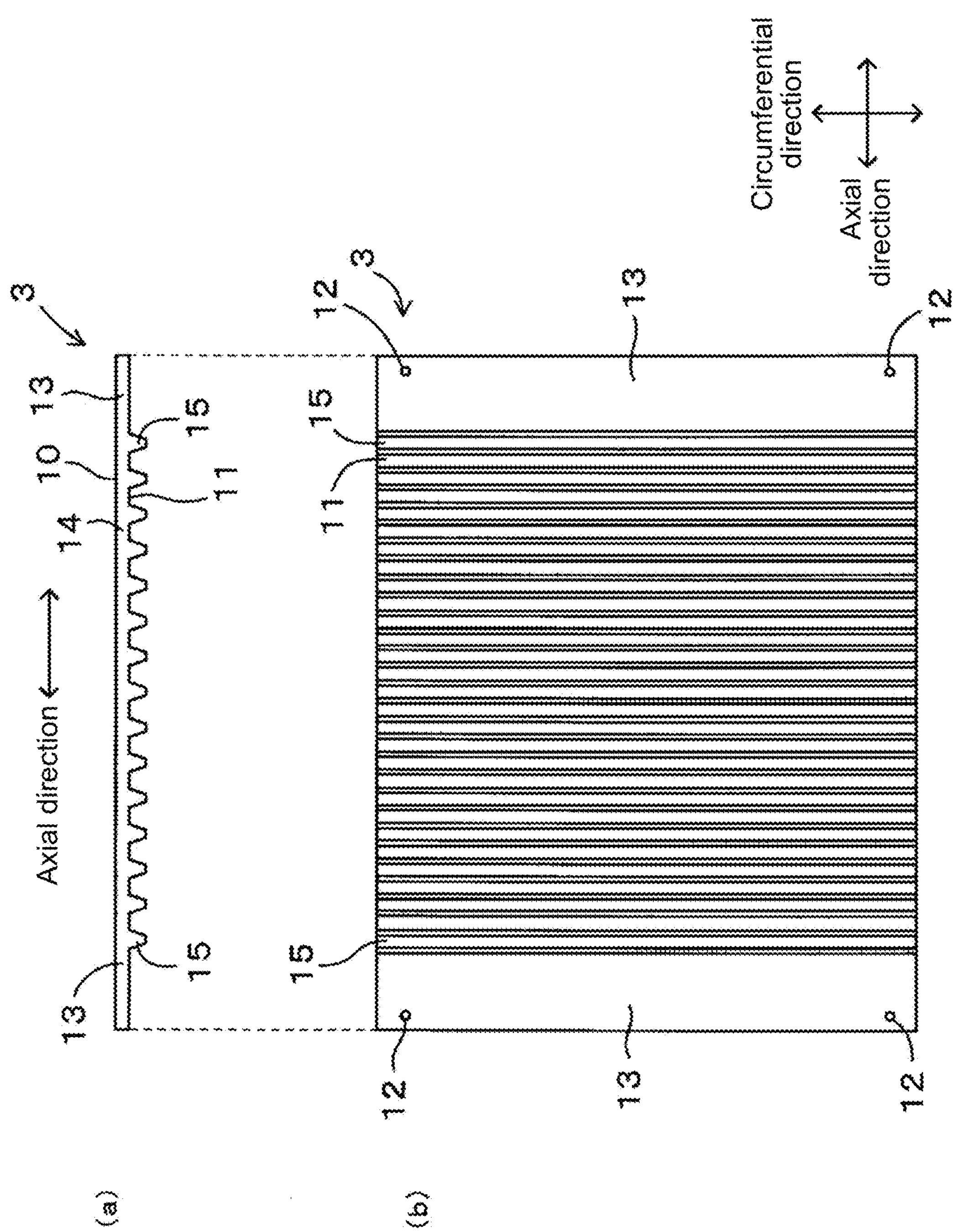
FIG. 3 is a view showing a sound-absorbing heat-dissipating sheet of Embodiment 1, where (a) is a top view, and (b) is a front view.

As shown in (a) of FIG. 3 and (b) of FIG. 3, although not particularly limited, in this embodiment, the sound-absorbing heat-dissipating sheet 3 is formed into a substantially rectangular shape in a plan view. The sound-absorbing heat-dissipating sheet 3 is formed into a surface shape as a whole. In a state of being mounted to the target object 2, the sound-absorbing heat-dissipating sheet 3 includes a pair of first mounting parts 13 formed at positions near both ends in the axial direction (an example of a first direction) of the target object 2, and a heat-dissipating region 14 formed between the pair of first mounting parts 13. First insertion holes 12 penetrating the sound-absorbing heat-dissipating sheet 3 are formed at four corner parts of the sound-absorbing heat-dissipating sheet 3 at which the pair of first mounting parts 13 are formed. As described above, the first insertion holes 12 are configured for bolts 5 to insert therein. The covering surface 10 of the sound-absorbing heat-dissipating sheet 3 covers and contacts a part of the surface of the target object 2.

A plurality of ridges 15 are formed protruding outward on the heat-dissipating surface 11 of the heat-dissipating region 14. The plurality of ridges 15 are formed to extend in a plane direction of the sound-absorbing heat-dissipating sheet 3. Specifically, with the sound-absorbing heat-dissipating sheet 3 mounted to the target object 2, the plurality of ridges 15 are formed extending in a straight line shape along the circumferential direction of the outer circumferential surface of the target object 2. The plurality of ridges 15 are arranged side by side at an interval in the axial direction of the target object 2 on the heat-dissipating surface 11 of the heat-dissipating region 14. In this embodiment, the plurality of ridges 15 are formed to be arranged side by side at an equal interval. However, the shape of the plurality of ridges 15 may also be a wave shape in a plan view. Further, the plurality of ridges 15 may also be formed to extend in the axial direction of the outer circumferential surface of the target object 2, or may also be formed into a shape that extends in a direction inclined with respect to the circumferential direction and the axial direction of the outer circumferential surface of the target object 2.

In the case where the sound-absorbing heat-dissipating sheet 3 is formed of, for example, a foamed resin containing a heat-conductive material, the heat-conductive material may be extended continuously in a surface normal direction of the sound-absorbing heat-dissipating sheet 3, from the covering surface 10 of the sound-absorbing heat-dissipating sheet 3 to a tip of the ridge 15. Accordingly, by continuously disposing the heat-conductive material in a range from the surface of the target object 2 to the tip of the ridge 15, a high heat dissipation performance can be exhibited. The heat-conductive material of this case may be an electrically conductive filler.

In the case where the sound-absorbing heat-dissipating sheet 3 is formed of, for example, a foamed resin containing a heat-conductive material, the heat-conductive material may be extended continuously in an extending direction of the ridge 15 on a tip side of the ridge 15. Accordingly, by continuously disposing the heat-conductive material in a range from one end side to the other end side in the extending direction of the ridge 15, a high heat dissipation performance can also be exhibited in the plane direction. Examples of the heat-conductive material applicable in this case may include a metal foil such as copper, stainless steel, steel, or aluminum, a metal film such as an aluminum-deposited film, an electrically conductive filler, a heat-conductive resin film, etc. Further, a metal foil or a metal film and a resin film may also be laminated. The heat-conductive material may also be provided only in specific regions of the plurality of ridges 15 or provided at specific ridges 15 only, and may also be disposed on an outer surface on a tip side or a lateral surface of the ridge 15.

Further, in the case where the sound-absorbing heat-dissipating sheet 3 is formed of a foamed resin, the sound-absorbing heat-dissipating sheet 3 may be configured as follows. The heat-dissipating surface 11 side of the sound-absorbing heat-dissipating sheet 3 may be in a closed-cell state in which cells of the foamed resin are closed, and the covering surface 10 side may be in an open-cell state in which the cells of the foamed resin are open. By configuring the heat-dissipating surface 11 side in the closed-cell state, a pressure loss during circulation of a fluid such as air can be suppressed, so the heat dissipation performance can be enhanced. On the other hand, by configuring the covering surface 10 side in the open-cell state, a sound absorption performance can be enhanced. In other words, with the above configuration, the sound absorption performance and the heat dissipation performance can be improved.

Figure 4:
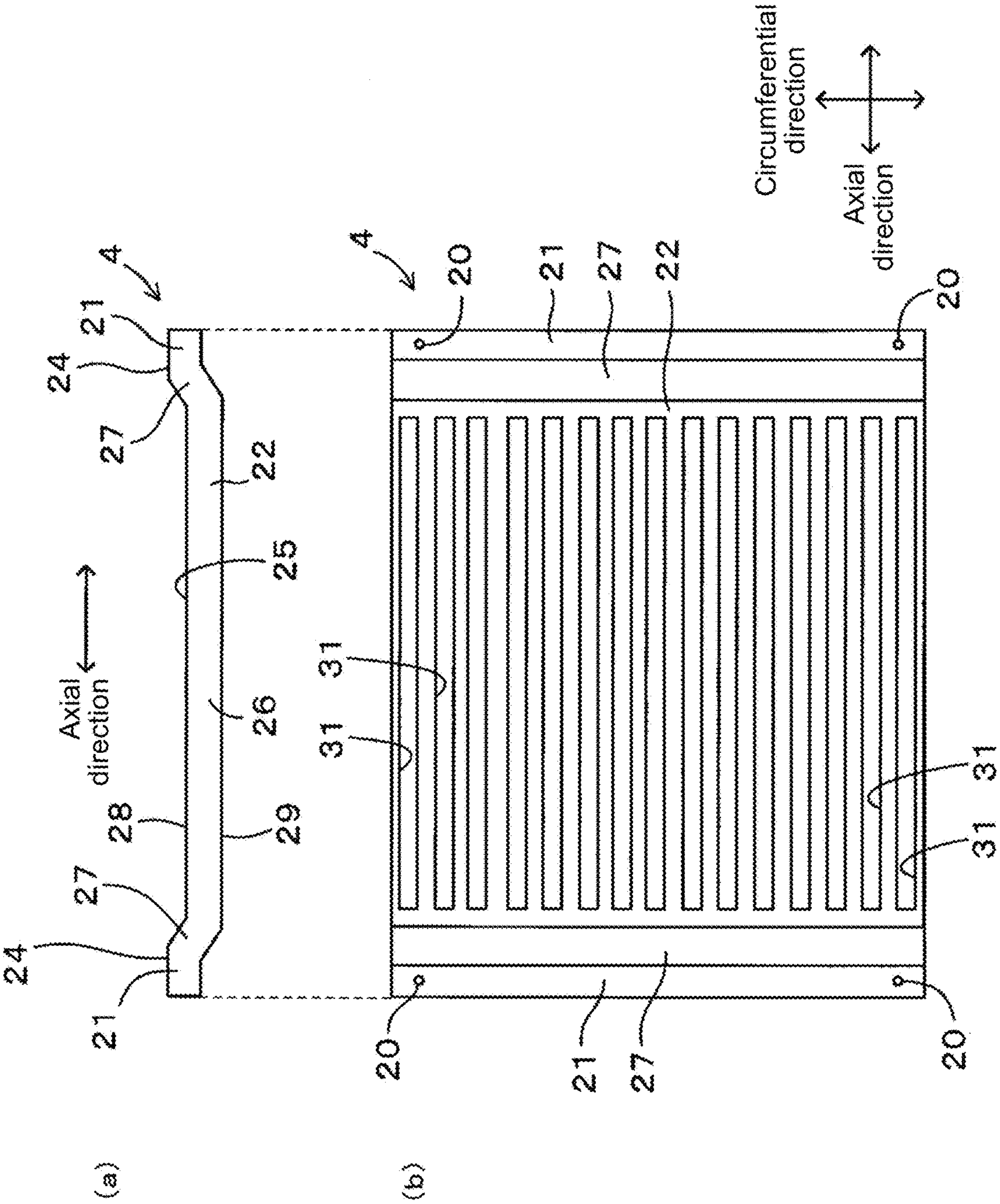
FIG. 4 is a view showing a reinforcing member of Embodiment 1, where (a) is a top view, and (b) is a front view.

As shown in (a) of FIG. 4 and (b) of FIG. 4, in this embodiment, the reinforcing member 4 is composed of one component only. However, the reinforcing member 4 may also be composed of a plurality of divided bodies.

The reinforcing member 4 is formed into a substantially rectangular shape in a plan view. The reinforcing member 4 is formed in an approximately same size as the sound-absorbing heat-dissipating sheet 3 in a plan view. In a state of being mounted to the target object 2, the reinforcing member 4 includes a pair of second mounting parts 21 formed at positions near both ends in the axial direction of the target object 2, and a bridging part 22 that bridges between the pair of second mounting parts 21.

The pair of second mounting parts 21 are configured to be respectively mounted to the pair of first mounting parts 13 of the sound-absorbing heat-dissipating sheet 3. The pair of second mounting parts 21 have mounting surfaces 24 that are opposed to the pair of first mounting parts 13 and are mounted to the pair of first mounting parts 13 by a conventional means such as an adhesive or a double-sided tape 23. In this embodiment, the second mounting part 21 is mounted to the first mounting part 13 by a double-sided tape 23. In the axial direction of the target object 2, a width dimension of the pair of second mounting parts 21 is smaller than a width dimension of the pair of first mounting parts 13. Second insertion holes 20 penetrating the second mounting parts 21 are formed at the pair of second mounting parts 21. As described above, the second insertion holes 20 are configured for the bolts 5 to insert therein.

The bridging part 22 includes an accommodating recess 25 formed into a recess shape in a direction away from the sound-absorbing heat-dissipating sheet, on a surface on a side opposed to the sound-absorbing heat-dissipating sheet 3. With the second mounting parts 21 of the reinforcing member mounted to the first mounting parts 13 of the sound-absorbing heat-dissipating sheet 3, the accommodating recess 25 of the reinforcing member is configured to accommodate the heat-dissipating region 14 of the sound-absorbing heat-dissipating sheet 3. The second mounting part 21 and a bottom wall 26 of the accommodating recess 25 are connected by an inclined wall 27 that expands to the second mounting part 21 side. The bottom wall 26 of the accommodating recess 25 has an inner surface 28 opposed to the sound-absorbing heat-dissipating sheet 3, and an outer surface 29 on the opposite side of the inner surface 28.

As shown in (a) of FIG. 2, with the reinforcing member 4 mounted to the sound-absorbing heat-dissipating sheet 3, ventilation holes 30 are formed on both lateral surfaces of the bridging part 22 that intersect with the circumferential direction of the target object 2 to allow air to circulate with respect to the heat-dissipating region 14 of the sound-absorbing heat-dissipating sheet 3. As described above, since air is capable of circulating along the circumferential direction of the target object 2, air is capable of flowing into the reinforcing member 4 from the ventilation holes 30 and flowing out to outside. The plurality of ridges 15 of the sound-absorbing heat-dissipating sheet 3 are exposed at the ventilation holes 30. Accordingly, the air flowing into the reinforcing member 4 from the ventilation holes 30 and flowing out to outside is capable of contacting the plurality of ridges 15. As a result, the heat dissipation performance of the soundproof heat-dissipating cover 1 is improved. Furthermore, as described above, since the plurality of ridges 15 are formed to extend in a straight line shape, circulation of air is not obstructed. Accordingly, the heat dissipation performance of the soundproof heat-dissipating cover 1 can be improved. However, as described above, in the case where air flows along the axial direction of the drive motor, by configuring the plurality of ridges 15 to extend along the axial direction, obstruction to circulation of air can be suppressed.

As shown in (b) of FIG. 2 and (b) of FIG. 4, the bridging part 22 includes a plurality of through-holes 31 that penetrate the bridging part 22. In this embodiment, the plurality of through-holes 31 are formed into an elongated slit shape extending in a direction in which the plurality of ridges 15 of the sound-absorbing heat-dissipating sheet 3 are arranged side by side. The plurality of through-holes 31 are formed to be arranged side by side at an interval in the extending direction of the plurality of ridges 15. In this embodiment, the direction in which the plurality of through-holes 31 extend is orthogonal to the direction in which the plurality of ridges 15 extend. However, the direction in which the plurality of through-holes 31 extend and the direction in which the plurality of ridges 15 extend may also be configured to be inclined and intersect with each other.

In relation to the target object 2, the shape of the plurality of through-holes 31 is described as follows: the plurality of through-holes 31 are formed into an elongated slit shape extending in the axial direction of the target object 2, and are formed to be arranged side by side at an interval along the circumferential direction of the outer surface 29 of the target object 2.

In this embodiment, the plurality of through-holes 31 are of the same shape and the same size. Further, the plurality of through-holes 31 are arranged side by side at an equal interval. However, the shape and the size of the plurality of through-holes 31 may also differ from each another, and the intervals between the plurality of through-holes 31 may also differ from each other.

Figure 5:
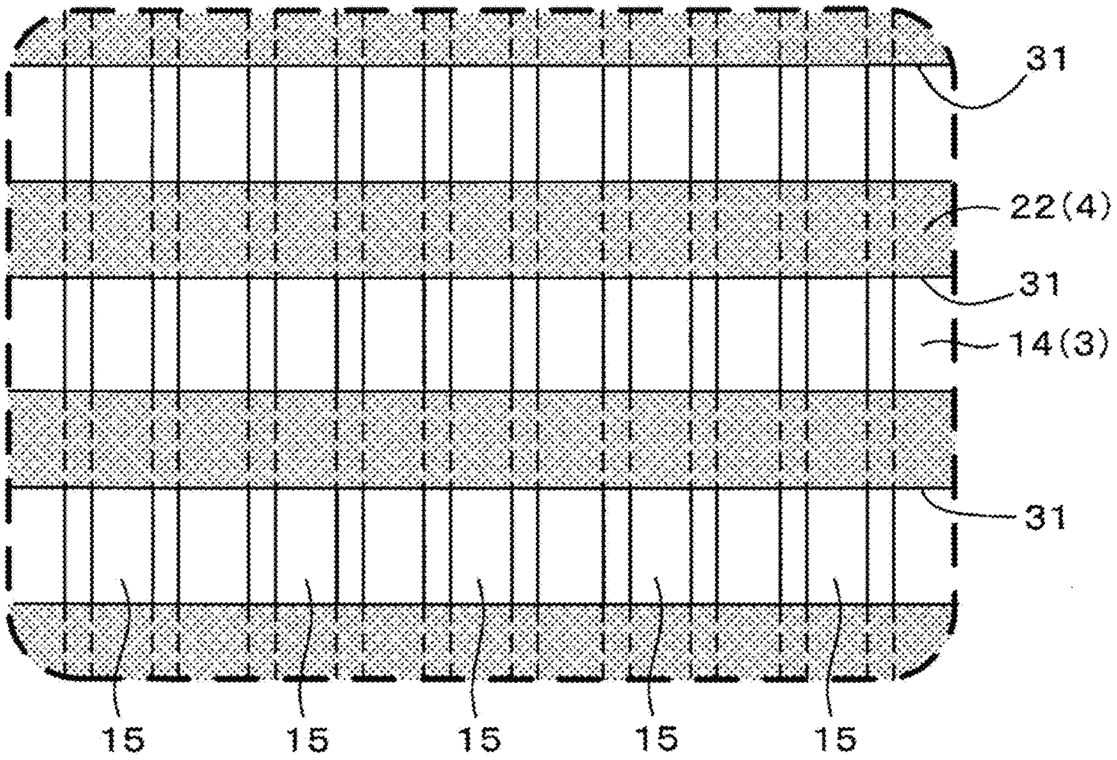
FIG. 5 is a partially enlarged front view showing a region R in FIG. 2.

As shown in (b) of FIG. 2 and FIG. 5, with the reinforcing member 4 mounted to the sound-absorbing heat-dissipating sheet 3, at least one ridge 15 is exposed to outside from at least one through-hole 31. Accordingly, since heat generated from the target object 2 can be dissipated to outside through the through-holes 31 from the ridges 15 of the sound-absorbing heat-dissipating sheet 3, the heat dissipation performance of the soundproof heat-dissipating cover 1 can be improved. In the illustration in FIG. 5, the color tone of the bridging part 22 is changed to make it easier to distinguish between the bridging part 22 and the through-holes 31.

Figure 6:
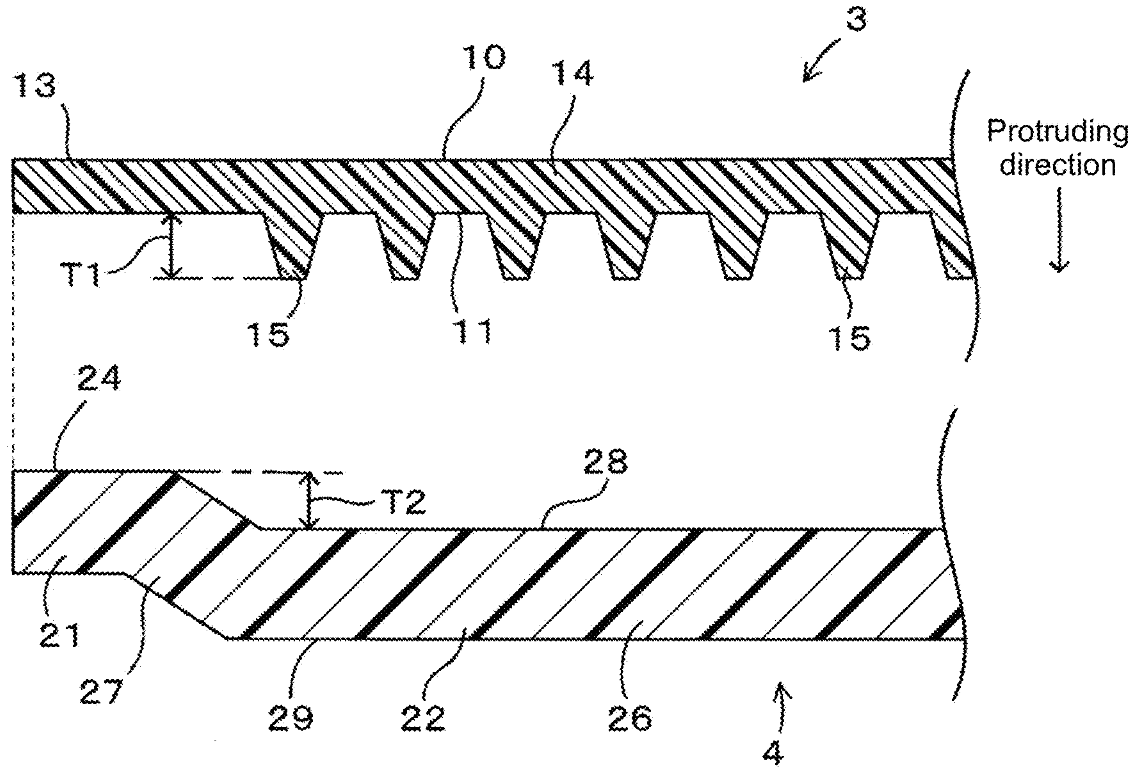
FIG. 6 is a partially enlarged cross-sectional view showing a state before the reinforcing member is mounted to the sound-absorbing heat-dissipating sheet in Embodiment 1.

As shown in FIG. 6, in this embodiment, in a state before the reinforcing member 4 is mounted to the sound-absorbing heat-dissipating sheet 3, a protrusion height dimension T1 of the ridge 15 protruding on the heat-dissipating surface 11 of the sound-absorbing heat-dissipating sheet 3 is set to be larger than a height dimension T2 between the mounting surface 24 of the second mounting part 21 and the inner surface 28 of the bridging part 22 of the reinforcing member 4. However, the protrusion height dimension T1 of the ridge 15 protruding on the heat-dissipating surface 11 of the sound-absorbing heat-dissipating sheet 3 may also be set to be equal to the height dimension T2 between the mounting surface 24 of the second mounting part 21 and the inner surface 28 of the bridging part 22 of the reinforcing member 4.

Although the state in which the sound-absorbing heat-dissipating sheet 3 is supported from below by the reinforcing member 4 has been described in this embodiment, the relative positional relationship between the sound-absorbing heat-dissipating sheet 3 and the reinforcing member 4 is not particularly limited.

Figure 7:
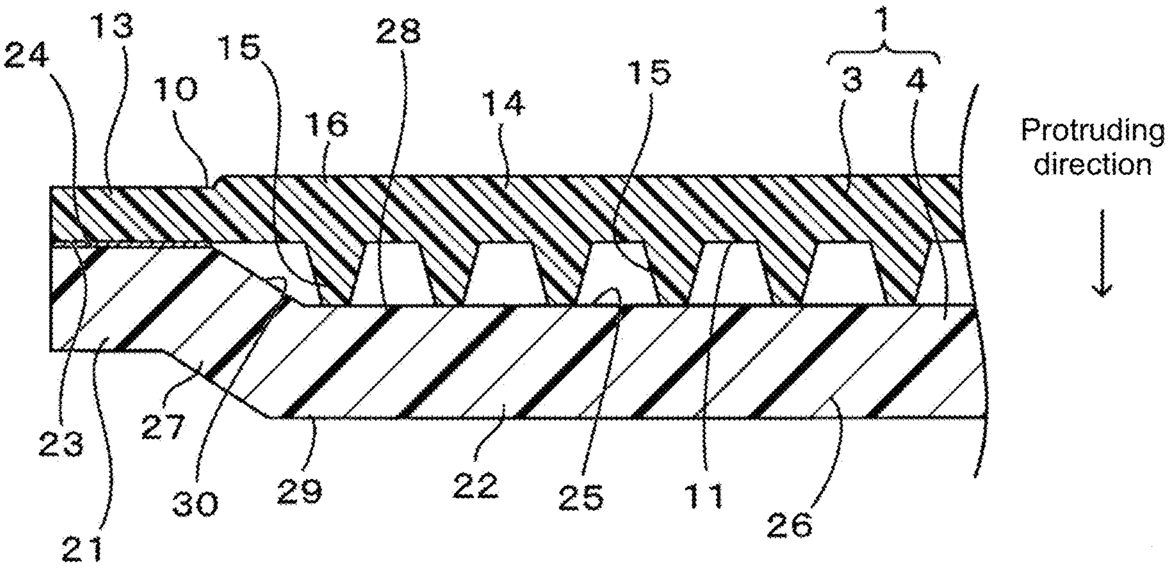
FIG. 7 is a partially enlarged cross-sectional view showing a state in which the reinforcing member is mounted to the sound-absorbing heat-dissipating sheet in Embodiment 1.

As shown in FIG. 7, with the reinforcing member 4 mounted to the sound-absorbing heat-dissipating sheet 3, a tip of the ridge 15 of the sound-absorbing heat-dissipating sheet 3 abuts against the inner surface 28 of the bridging part 22 of the reinforcing member 4. Furthermore, as described above, in this embodiment, the protrusion height dimension T1 of the ridge 15 in the state before the reinforcing member 4 is mounted to the sound-absorbing heat-dissipating sheet 3 is set to be larger than the height dimension T2 between the mounting surface 24 of the second mounting part 21 and the inner surface 28 of the bridging part 22 of the reinforcing member 4. Thus, with the reinforcing member 4 mounted to the sound-absorbing heat-dissipating sheet 3, the ridge 15 becomes compressed in the protruding direction of the ridge 15 by the bridging part 22 of the reinforcing member.

With the plurality of ridges 15 of the sound-absorbing heat-dissipating sheet 3 abutting against the bridging part 22 of the reinforcing member 4, the plurality of ridges 15 of the sound-absorbing heat-dissipating sheet 3 are supported by the bridging part 22 of the reinforcing member 4. Accordingly, deformation of the sound-absorbing heat-dissipating sheet 3 into a protruding shape in a direction from the covering surface 10 toward the heat-dissipating surface 11 is suppressed. As a result, since deflection deformation of the covering surface 10 of the sound-absorbing heat-dissipating sheet 3 away from the target object 2 is suppressed, formation of a gap between the target object 2 and the covering surface 10 of the sound-absorbing heat-dissipating sheet 3 is suppressed. Accordingly, since heat generated from the target object 2 is quickly conducted to the sound-absorbing heat-dissipating sheet 3, the heat dissipation performance of the soundproof heat-dissipating cover 1 is improved.

Further, with the plurality of ridges 15 receiving pressure from the reinforcing member 4 and compressed, the sound-absorbing heat-dissipating sheet 3 is pressed against the target object 2. Accordingly, adhesion between the sound-absorbing heat-dissipating sheet 3 and the target object 2 is improved. As a result, the heat dissipation performance of the soundproof heat-dissipating cover 1 is further improved.

As shown in FIG. 7, with the ridge 15 compressed by the bridging part 22 of the reinforcing member 4, at least a part of the covering surface 10 of the sound-absorbing heat-dissipating sheet 3 includes a bulging part 16 that bulges to the side opposite to the reinforcing member 4. In this embodiment, the entire covering surface 10 in the heat-dissipating region 14 of the sound-absorbing heat-dissipating sheet 3 forms the bulging part 16. In this embodiment, the bulging part 16 includes the heat-conductive material described above. However, it is also possible that a part of the covering surface 10 of the sound-absorbing heat-dissipating sheet 3 bulges, and it is also possible that the covering surface 10 of the sound-absorbing heat-dissipating sheet 3 does not include a bulging part 16.

Figure 8:
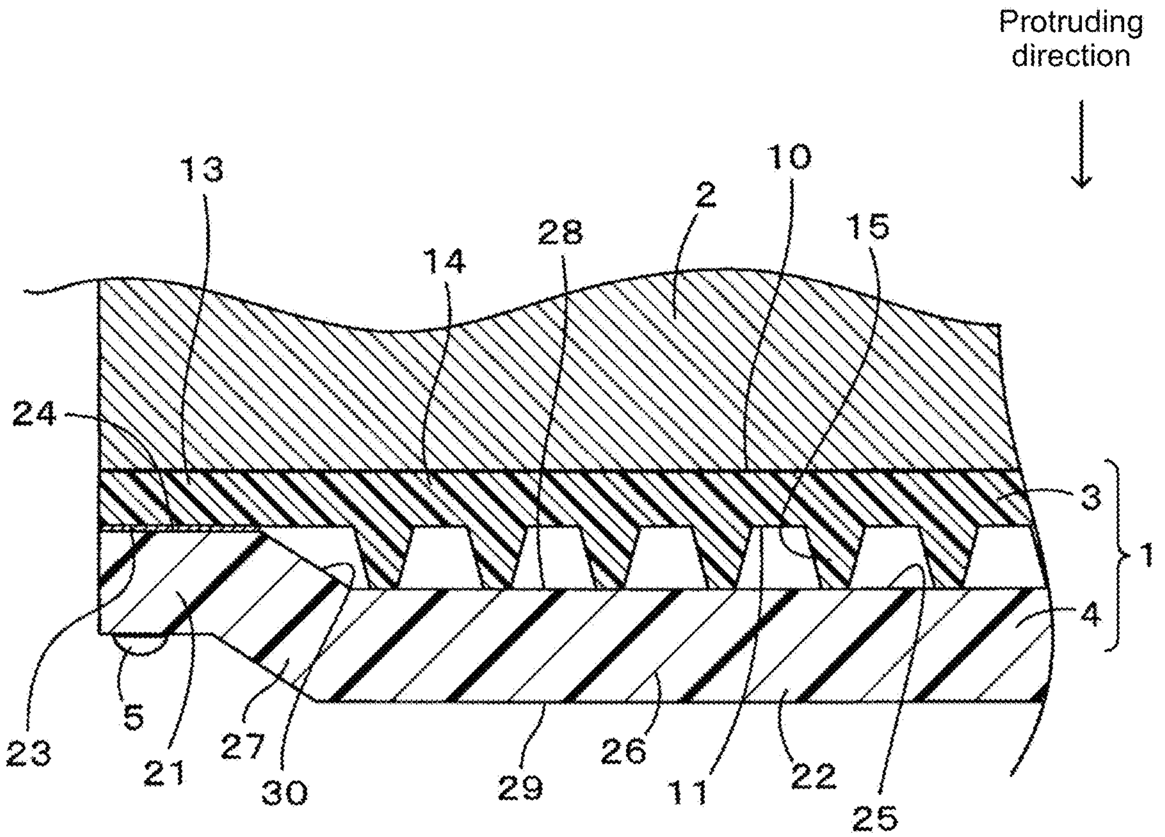
FIG. 8 is a partially enlarged cross-sectional view showing a state in which the soundproof heat-dissipating cover of Embodiment 1 is mounted to the target object.

As shown in FIG. 8, with the soundproof heat-dissipating cover 1 mounted to the target object 2, the covering surface 10 of the sound-absorbing heat-dissipating sheet 3 covers the surface of the target object. The bulging part 16 bulging on the covering surface 10 of the sound-absorbing heat-dissipating sheet 3 reliably contacts the target object 2 and is compressed by the target object 2. Accordingly, since adhesion between the sound-absorbing heat-dissipating sheet 3 and the target object 2 is improved, the heat dissipation performance of the soundproof heat-dissipating cover 1 is improved. Although the state in which the soundproof heat-dissipating cover 1 is mounted to the lower surface of the target object 2 has been described in this embodiment, the portion of the target object 2 to which the soundproof heat-dissipating cover 1 is mounted is not particularly limited.

Further, with the bulging part 16 being defined on the entire covering surface 10 in the heat-dissipating region 14, since adhesion between the sound-absorbing heat-dissipating sheet 3 and the target object 2 is improved over the entire covering surface 10 in the heat-dissipating region 14, the heat dissipation performance of the soundproof heat-dissipating cover 1 is improved.

Further, by including the heat-conductive material in the bulging part 16, since it becomes possible to quickly transfer heat emitted by the target object 2 to the sound-absorbing heat-dissipating sheet 3, the heat dissipation performance of the soundproof heat-dissipating cover 1 is improved.

Embodiment 2

Figure 9:
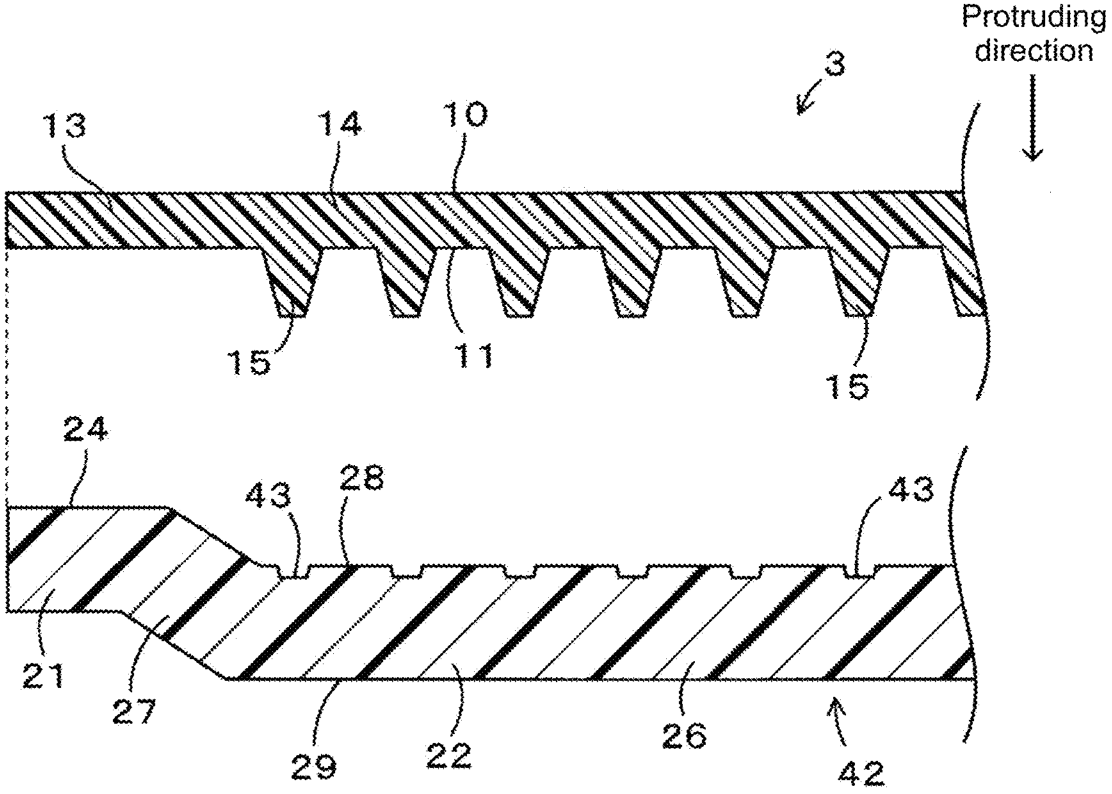
FIG. 9 is a partially enlarged cross-sectional view showing a state before a reinforcing member is mounted to a sound-absorbing heat-dissipating sheet in Embodiment 2.

Next, referring to FIG. 9 and FIG. 10, a soundproof heat-dissipating cover 41 of Embodiment 2 will be described. As shown in FIG. 9, a reinforcing member 42 of the soundproof heat-dissipating cover 41 in this embodiment has fitting recesses 43 on the inner surface 28 of the bridging part 22. With the reinforcing member 42 mounted to the sound-absorbing heat-dissipating sheet 3, the fitting recesses 43 are formed as depressed at positions opposed to the tips of the plurality of ridges 15 of the sound-absorbing heat-dissipating sheet 3. Similar to the plurality of ridges 15, the fitting recesses 43 are formed extending along the circumferential direction of the target object 2. An opening of the fitting recess 43 is formed in a size allowing the tip of the ridge 15 to fit therein.

Figure 10:
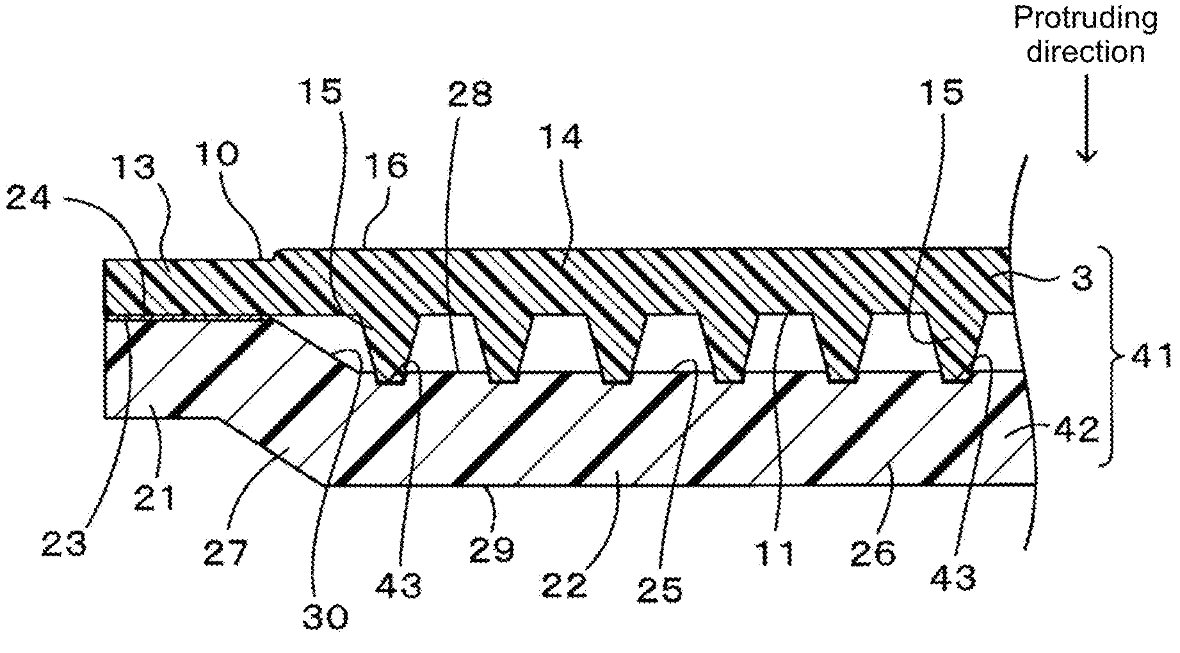
FIG. 10 is partially enlarged cross-sectional view showing a state in which the reinforcing member is mounted to the sound-absorbing heat-dissipating sheet in Embodiment 2.

As shown in FIG. 10, with the reinforcing member 42 mounted to the sound-absorbing heat-dissipating sheet 3, the tip of the ridge 15 is configured to fit into the fitting recess 43. Accordingly, deflection deformation of the ridge 15 due to gravity or heat of the target object 2 is suppressed. As a result, since formation of a gap between the ridge 15 of the sound-absorbing heat-dissipating sheet 3 and the bridging part 22 of the reinforcing member 42 is suppressed, the heat dissipation performance of the soundproof heat-dissipating cover 41 can be improved.

Among the reference signs used in Embodiment 2 and subsequent embodiments, reference signs identical to the reference signs used in previous embodiments represent similar components as in the previous embodiments unless otherwise specified.

Embodiment 3

Figure 11:
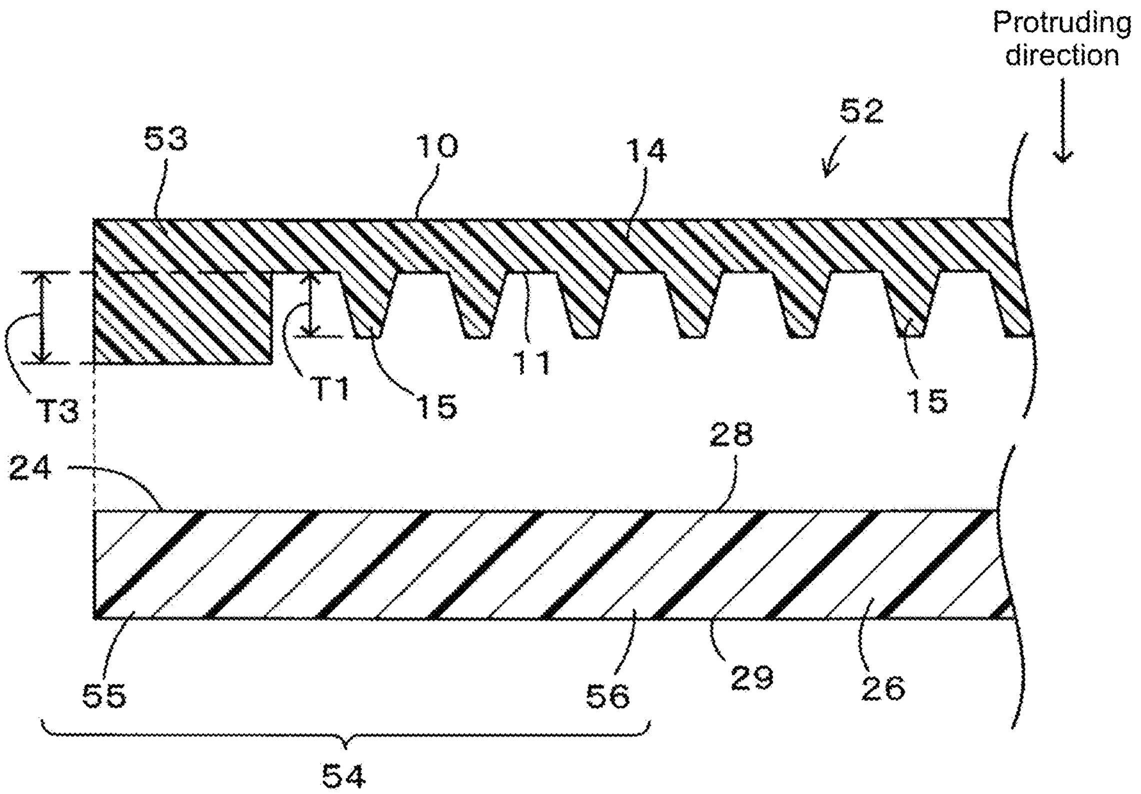
FIG. 11 is a partially enlarged cross-sectional view showing a state before a reinforcing member is mounted to a sound-absorbing heat-dissipating sheet in Embodiment 3.

Next, referring to FIG. 11 and FIG. 12, a soundproof heat-dissipating cover 51 of Embodiment 3 will be described. As shown in FIG. 11, a first mounting part 53 provided at a sound-absorbing heat-dissipating sheet 52 in this embodiment is formed protruding in the protruding direction of the ridge 15. A protrusion height dimension T3 of the first mounting part 53 is set to be larger than the protrusion height dimension T1 of the ridge 15. Accordingly, a step is formed between the first mounting part 53 and the heat-dissipating region 14 in the protruding direction of the ridge 15.

A reinforcing member 54 in this embodiment is formed into a flat plate shape. A step is not formed between a pair of second mounting parts 55 and a portion other than the pair of second mounting parts 55 on the inner surface 28 of the reinforcing member 54.

Figure 12:
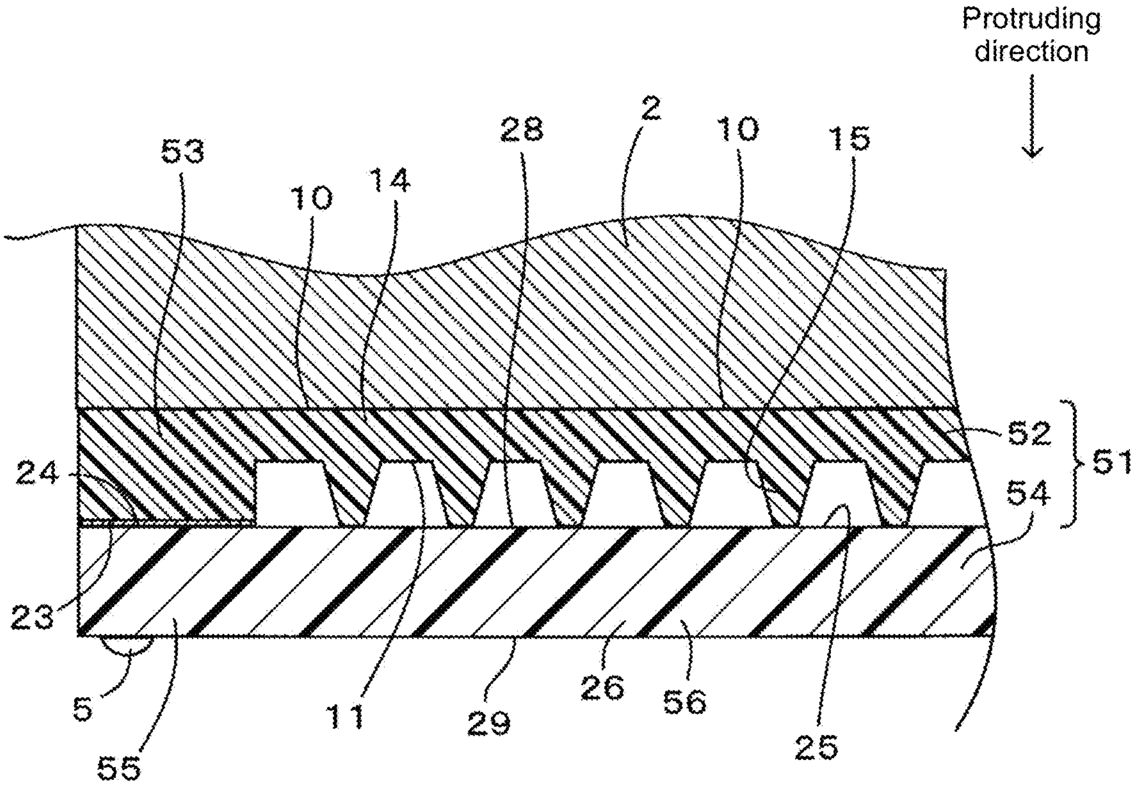
FIG. 12 is a partially enlarged cross-sectional view showing a state in which the soundproof heat-dissipating cover of Embodiment 3 is mounted to the target object.

As shown in FIG. 12, with the second mounting part 55 of the reinforcing member 54 mounted to the first mounting part 53 of the sound-absorbing heat-dissipating sheet 52, a space is formed by the protrusion height dimension T3 of the first mounting part 53 between the heat-dissipating region 14 of the sound-absorbing heat-dissipating sheet 52 and the bridging part 56 of the reinforcing member 54. This space is configured to accommodate the heat-dissipating region 14 and the plurality of ridges 15 of the sound-absorbing heat-dissipating sheet 52. The protrusion height dimension T3 of the first mounting part 53 may also be set to be smaller than the protrusion height dimension T1 of the ridge 15. In that case, the plurality of ridges 15 are accommodated in the space in a compressed state.

Embodiment 4

Figure 13:
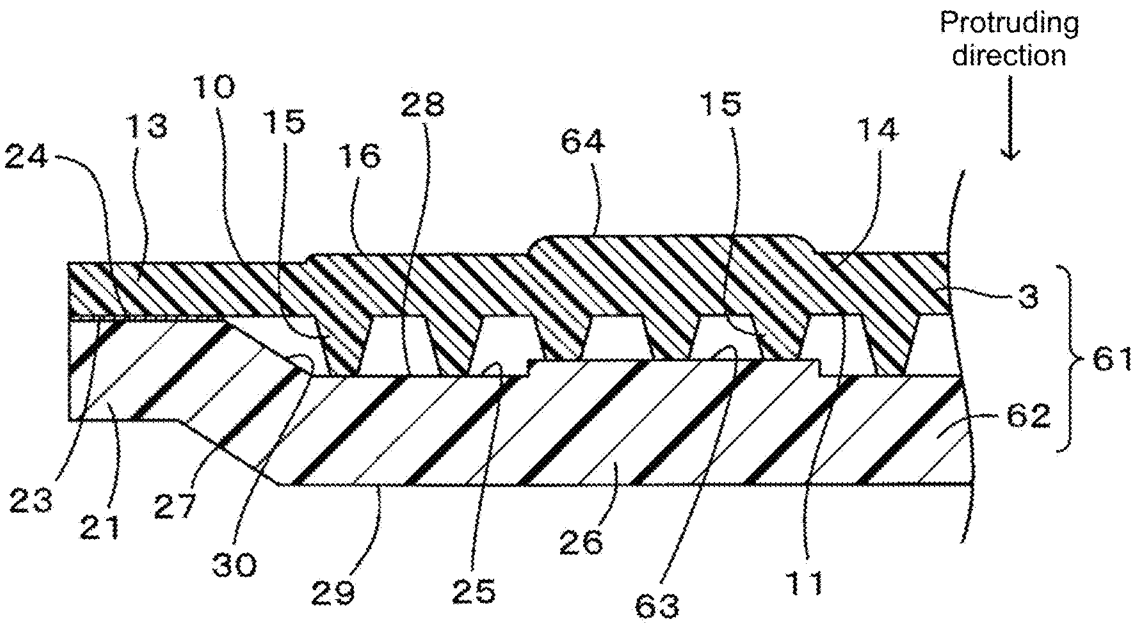
FIG. 13 is a partially enlarged cross-sectional view showing a state in which a reinforcing member is mounted to a sound-absorbing heat-dissipating sheet in Embodiment 4.

Next, referring to FIG. 13, a soundproof heat-dissipating cover 61 of Embodiment 4 will be described. In this embodiment, with a second mounting part 21 of a reinforcing member 62 mounted to the first mounting part 13 of the sound-absorbing heat-dissipating sheet 3, a compressing protrusion 63 protruding toward the sound-absorbing heat-dissipating sheet 3 is formed on an inner surface 28 of a bridging part 22 of a reinforcing member 62 of the soundproof heat-dissipating cover 61.

The compressing protrusion 63 may be formed at at least a part of the inner surface 28 of the bridging part 22. However, the entire inner surface 28 of the bridging part 22 may also serve as the compressing protrusion 63 with the entire inner surface 28 of the bridging part 22 protruding toward the sound-absorbing heat-dissipating sheet 3. Since the plurality of ridges 15 of the sound-absorbing heat-dissipating sheet 3 are compressed by the compressing protrusion 63, the heat dissipation performance of the soundproof heat-dissipating cover 61 is further improved.

As described above, with the plurality of ridges 15 compressed by the bridging part 22, a bulging part 16 is formed on the covering surface 10 of the sound-absorbing heat-dissipating sheet 3. Furthermore, with the ridges 15 compressed by the compressing protrusion 63, an additional bulging part 64 protruding further from the bulging part 16 is formed on the covering surface 10 of the sound-absorbing heat-dissipating sheet 3. The additional bulging part 64 is formed at a position that overlaps with the compressing protrusion 63 of the bridging part 22 in the protruding direction of the ridge 15.

With the soundproof heat-dissipating cover 61 mounted to the target object 2, the portion at which the additional bulging part 64 is formed is more strongly compressed by the target object 2. Accordingly, since formation of a gap between the sound-absorbing heat-dissipating sheet 3 and the target object is suppressed, the heat dissipation performance of the soundproof heat-dissipating cover 61 is further improved. This is particularly effective in the case where local high-temperature portions are present on the target object 2.

Embodiment 5

Figure 14:
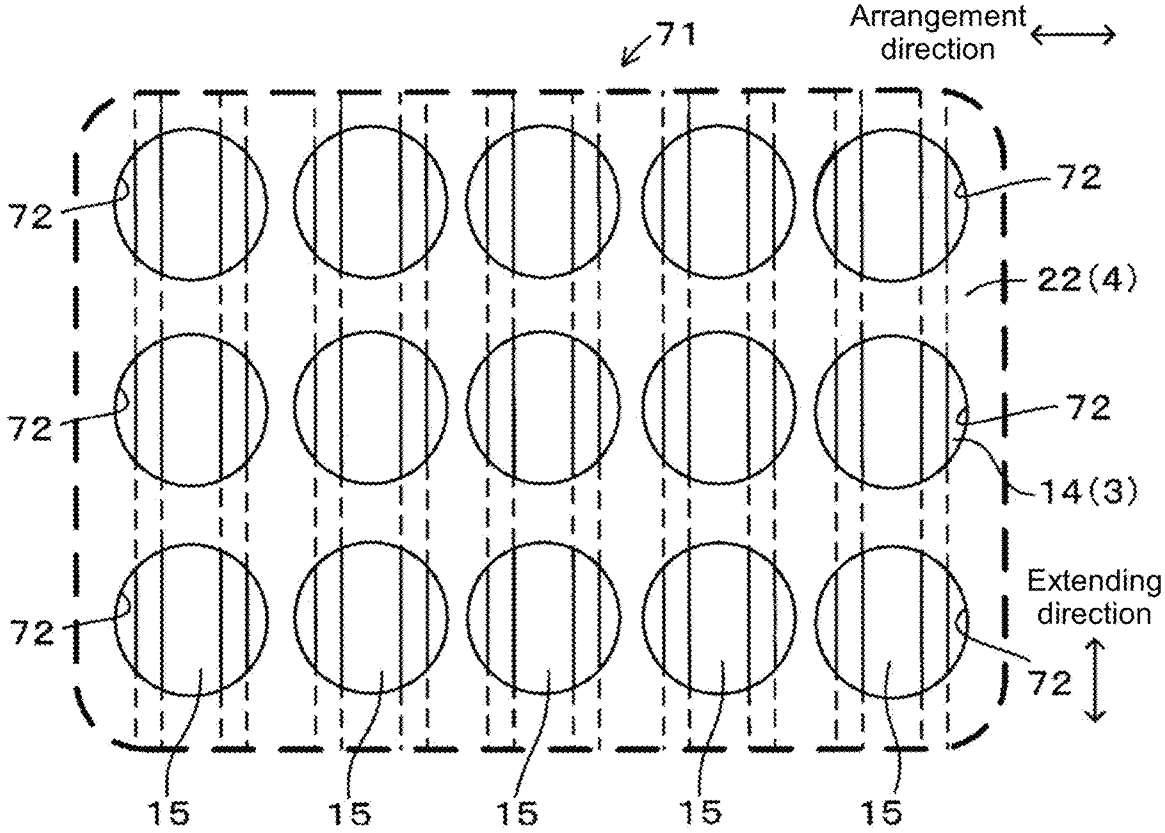
FIG. 14 is a partially enlarged front view showing a soundproof heat-dissipating cover of Embodiment 5 and showing a region corresponding to the region R in FIG. 2.

Next, referring to FIG. 14, a soundproof heat-dissipating cover 71 of Embodiment 5 will be described. As shown in FIG. 14, in this embodiment, a plurality of through-holes 72 with a circular inner shape are formed at the bridging part 22. The plurality of through-holes 72 are arranged side by side at an interval along the direction in which the plurality of ridges 15 extend, and are arranged side by side at an interval along the direction in which the plurality of ridges 15 are arranged. A part of the ridge 15 is exposed from each through-hole 72. Accordingly, heat generated by the target object 2 is transferred to the sound-absorbing heat-dissipating sheet 3, is then conducted to the ridge 15, and is dissipated to outside through the through-hole 72 from the ridge 15. Accordingly, the heat dissipation performance of the soundproof heat-dissipating cover 71 can be improved.

Further, a portion of the bridging part 22 at which the through-holes 72 are not formed abuts against the tips of the plurality of ridges 15. Accordingly, deformation of the sound-absorbing heat-dissipating sheet 3 away from the surface of the target object 2 is suppressed. As a result, since formation of a gap between the sound-absorbing heat-dissipating sheet 3 and the target object 2 is suppressed, the heat dissipation performance of the soundproof heat-dissipating cover 71 can be improved.

However, the plurality of through-holes 72 may also be configured to be disposed along only one of the extending direction of the ridge 15 and the arrangement direction of the ridges 15, and not along the other direction. Further, the plurality of through-holes 72 may also be disposed randomly, without being arranged along either of the extending direction of the ridge 15 and the arrangement direction of the ridges 15.

Embodiment 6

Figure 15:
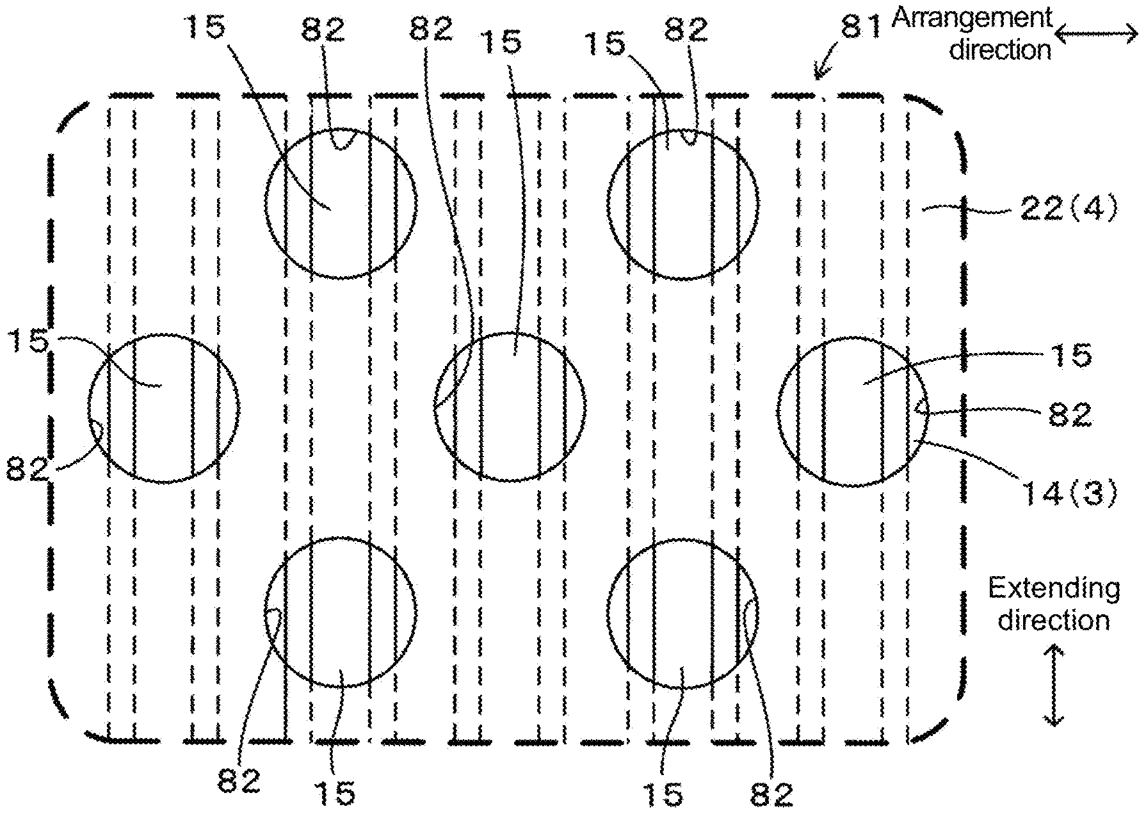
FIG. 15 is a partially enlarged front view showing a soundproof heat-dissipating cover of Embodiment 6 and showing a region corresponding to the region R in FIG. 2.

Next, referring to FIG. 15, a soundproof heat-dissipating cover 81 of Embodiment 6 will be described. In this embodiment, a plurality of through-holes 82 with a circular inner shape are disposed in a staggered pattern at the bridging part 22.

A portion of the bridging part 22 at which the plurality of through-holes 82 disposed in a staggered pattern are not formed defines a shape in which elongated strip-shaped portions intersect obliquely with both of the extending direction of the plurality of ridges 15 and the arrangement direction of the plurality of ridges 15. Accordingly, since the plurality of ridges 15 can be evenly supported without bias, deformation of the sound-absorbing heat-dissipating sheet 3 in a direction away from the target object 2 can be further suppressed. As a result, the heat dissipation performance of the soundproof heat-dissipating cover 81 can be improved.

Modification Example of Embodiment 6

Figure 16:
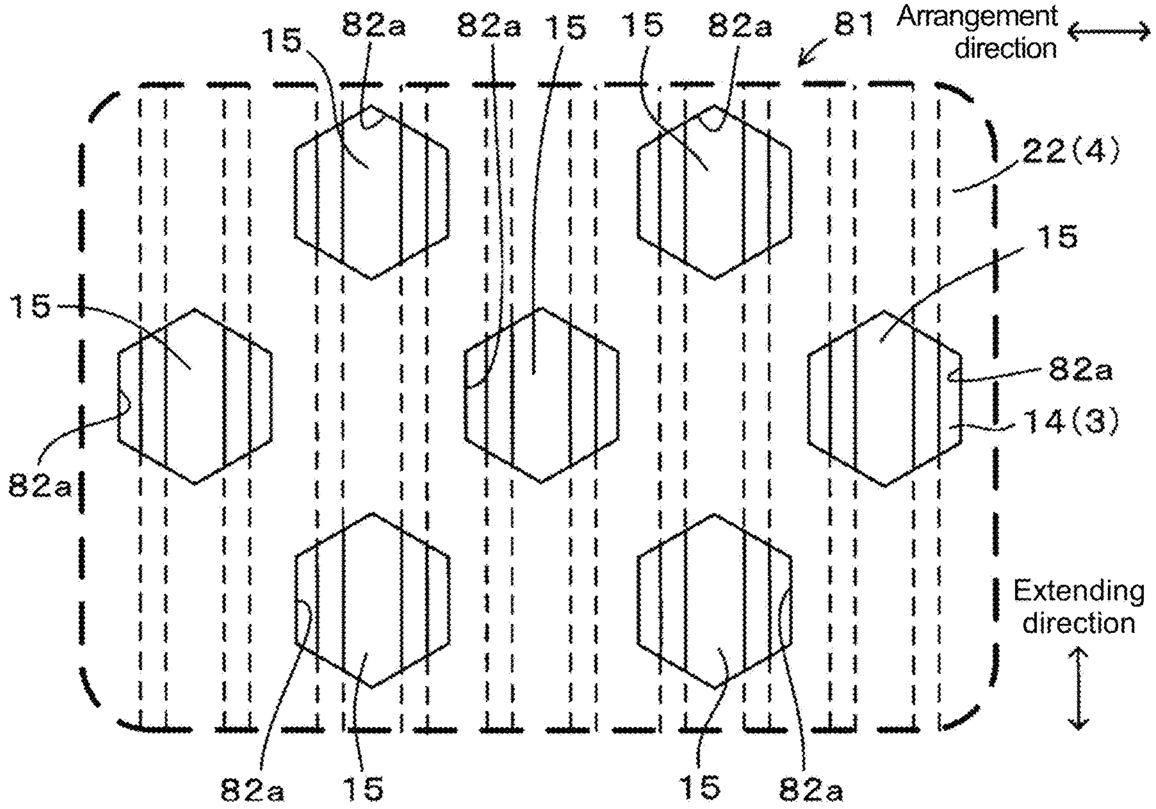
FIG. 16 is a partially enlarged front view showing a soundproof heat-dissipating cover of a modification example of Embodiment 6 and showing a region corresponding to the region R in FIG. 2.

FIG. 16 illustrates a modification example of Embodiment 6. In this embodiment, an inner shape of a plurality of through-holes 82*a* is formed into a hexagon. The inner shape of the plurality of through-holes 82*a* is not limited to a circle or a hexagon, and may also be a polygon such as a triangle, a square, a pentagon, etc., or may also be an elliptical shape, and any shape may be selected as appropriate.

Furthermore, the shape of the plurality of through-holes 82*a* may be configured such that sizes of the plurality of through-holes 82*a* are different from each other. For example, in the case where portions prone to becoming locally high-temperature are present on the target object 2, by configuring the size of the through-holes 82*a* corresponding to the portions prone to becoming high-temperature to be larger than other portions, the heat dissipation performance of the soundproof heat-dissipating cover 81 can be improved.

The present disclosure is not limited to the above-described embodiments, and is applicable to various embodiments within a scope without deviating from the spirit thereof.

The invention claimed is:

1. A soundproof heat-dissipating cover (1, 41, 61, 71, 81) covering a target object (2), the soundproof heat-dissipating cover comprising:
- a sound-absorbing heat-dissipating sheet (3) that is formed of a first sound-absorbing material into a surface shape, and comprises a covering surface (10) covering a surface of the target object and a heat-dissipating surface (11) on a side opposite to the covering surface; and
- a reinforcing member (4, 42, 62) that is formed of a material having a hardness higher than the first sound-absorbing material, and covers the sound-absorbing heat-dissipating sheet from a heat-dissipating surface side of the sound-absorbing heat-dissipating sheet, wherein
- the sound-absorbing heat-dissipating sheet further comprises:
  - a pair of first mounting parts (13, 53) formed at positions near both ends in a first direction along the covering surface; and
  - a heat-dissipating region (14) formed between the pair of first mounting parts, the heat-dissipating surface in the heat-dissipating region of the sound-absorbing heat-dissipating sheet is formed with a plurality of ridges (15) arranged side by side at an interval, the reinforcing member comprises:

a pair of second mounting parts (21, 55) that are formed at positions near both ends in the first direction and are respectively mounted to the pair of first mounting parts; and a bridging part (22, 56) that bridges between the pair of second mounting parts and has a plurality of through-holes (31, 72, 82*a*), and with the pair of second mounting parts of the reinforcing member mounted to the pair of first mounting parts of the sound-absorbing heat-dissipating sheet, the plurality of ridges of the sound-absorbing heat-dissipating sheet abut against the bridging part of the reinforcing member.

2. The soundproof heat-dissipating cover according to claim 1, wherein the reinforcing member is formed of a second sound-absorbing material having sound-absorbing properties.

3. The soundproof heat-dissipating cover according to claim 1, wherein the bridging part comprises an accommodating recess (25) that is formed on a surface on a side opposed to the sound-absorbing heat-dissipating sheet, is formed into a recess shape in a direction away from the sound-absorbing heat-dissipating sheet, and accommodates the heat-dissipating region of the sound-absorbing heat-dissipating sheet.

4. The soundproof heat-dissipating cover according to claim 1, wherein with the second mounting parts of the reinforcing member mounted to the first mounting parts of the sound-absorbing heat-dissipating sheet, the plurality of ridges are compressed by the bridging part of the reinforcing member in a direction in which the plurality of ridges protrude.

5. The soundproof heat-dissipating cover according to claim 4, wherein with the second mounting parts of the reinforcing member mounted to the first mounting parts of the sound-absorbing heat-dissipating sheet, at least a part of the covering surface in the heat-dissipating region comprises a bulging part (16) that bulges to a side opposite to the reinforcing member.

6. The soundproof heat-dissipating cover according to claim 5, wherein the entire covering surface in the heat-dissipating region defines the bulging part.

7. The soundproof heat-dissipating cover according to claim 1, wherein the bridging part comprises an accommodating recess that is formed on a surface on a side opposed to the sound-absorbing heat-dissipating sheet, is formed into a recess shape in a direction away from the sound-absorbing heat-dissipating sheet, and accommodates the heat-dissipating region of the sound-absorbing heat-dissipating sheet, and in a state before the second mounting parts of the reinforcing member are mounted to the first mounting parts of the sound-absorbing heat-dissipating sheet, at least a part of the plurality of ridges has a protrusion height dimension from the heat-dissipating surface of the sound-absorbing heat-dissipating sheet that is formed to be larger than a depth dimension of the accommodating recess depressed from the second mounting parts, and with the second mounting parts of the reinforcing member mounted to the first mounting parts of the sound-absorbing heat-dissipating sheet, at least a part of the plurality of ridges is compressed by the bridging part of the reinforcing member in a height direction in which the plurality of ridges protrude.

8. The soundproof heat-dissipating cover according to claim 1, wherein with the second mounting parts of the reinforcing member mounted to the first mounting parts of the sound-absorbing heat-dissipating sheet, the bridging part of the reinforcing member is provided with a fitting recess (43) into which tips of at least a part of the ridges among the plurality of ridges of the sound-absorbing heat-dissipating sheet fit.

9. The soundproof heat-dissipating cover according to claim 1, wherein with the second mounting parts of the reinforcing member mounted to the first mounting parts of the sound-absorbing heat-dissipating sheet, at least a part of the bridging part of the reinforcing member is formed with a compressing protrusion (63) that protrudes toward the sound-absorbing heat-dissipating sheet.

10. The soundproof heat-dissipating cover according to claim 1, wherein with the second mounting parts of the reinforcing member mounted to the first mounting parts of the sound-absorbing heat-dissipating sheet, at least two or more through-holes among the plurality of through-holes are formed to be arranged side by side at an interval along a direction in which the plurality of ridges extend.

11. The soundproof heat-dissipating cover according to claim 10, wherein at least two or more through-holes among the plurality of through-holes are formed into a slit shape elongated in a direction in which the plurality of ridges are arranged side by side, and are formed to be arranged side by side at an interval along a direction in which the plurality of ridges extend.

12. The soundproof heat-dissipating cover according to claim 11, wherein the plurality of ridges are formed to extend in a straight line shape, and at least two or more through-holes among the plurality of through-holes are formed into a slit shape elongated in a direction orthogonal to a direction in which the plurality of ridges extend.

13. The soundproof heat-dissipating cover according to claim 10, wherein at the bridging part of the reinforcing member, at least two or more through-holes among the plurality of through-holes are formed to be arranged side by side at an interval along a direction in which the plurality of ridges are arranged side by side.

14. The soundproof heat-dissipating cover according to claim 10, wherein the plurality of through-holes are disposed in a staggered pattern.

15. The soundproof heat-dissipating cover according to claim 1, wherein the plurality of through-holes comprise through-holes in sizes different from each other.

16. The soundproof heat-dissipating cover according to claim 1, wherein at least a part of the heat-dissipating region comprises a heat-conductive material, and the heat-conductive material extends along a surface normal direction of the sound-absorbing heat-dissipating sheet.

17. The soundproof heat-dissipating cover according to claim 16, wherein the heat-conductive material extends along a direction in which the plurality of ridges extend, on a tip side of the plurality of ridges of the sound-absorbing heat-dissipating sheet.

18. The soundproof heat-dissipating cover according to claim 16, wherein with the second mounting parts of the reinforcing member mounted to the first mounting parts of the sound-absorbing heat-dissipating sheet, at least a part of the covering surface in the heat-dissipating region comprises a bulging part that bulges to a side opposite to the reinforcing member, and the heat-conductive material is included in the bulging part.

* * * * *